(12) United States Patent
Varghese et al.

(10) Patent No.: US 6,225,808 B1
(45) Date of Patent: May 1, 2001

(54) TEST COUNTER FOR ELECTRONIC BATTERY TESTER

(75) Inventors: Philip Varghese, Wheaton, IL (US); Michael R. Cable, Hudson, OH (US); David J. Lewis, Naperville; Michael E. Troy, Lockport, both of IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/513,046

(22) Filed: Feb. 25, 2000

(51) Int. Cl.[7] .............................. H02J 7/00; G01R 31/36; G01N 27/416
(52) U.S. Cl. .......................... 324/426; 324/430; 320/133; 702/63
(58) Field of Search ................................... 324/426, 430; 320/133, 155; 702/63

(56) References Cited

U.S. PATENT DOCUMENTS

| 2,514,745 | 7/1950 | Dalzell | 171/95 |
| 3,356,936 | 12/1967 | Smith | 324/29.5 |

(List continued on next page.)

FOREIGN PATENT DOCUMENTS

| 0 022 450 A1 | 1/1981 | (EP) . |
| 29 26 716 B1 | 1/1981 | (DE) . |
| 0 637 754 A1 | 2/1995 | (EP) . |
| 0 772 056 A1 | 5/1997 | (EP) . |
| 2 749 397 | 12/1997 | (FR) . |
| 0 088 159 | 6/1982 | (GB) . |
| 59-17892 | 1/1984 | (JP) . |
| 59-17893 | 1/1984 | (JP) . |
| 59-17894 | 1/1984 | (JP) . |
| 59017894 | 1/1984 | (JP) . |
| 59-215674 | 12/1984 | (JP) . |
| 60-225078 | 11/1985 | (JP) . |
| 62-180284 | 8/1987 | (JP) . |
| 03274479 | 12/1991 | (JP) . |
| 03282276 | 12/1991 | (JP) . |
| 04131779 | 5/1992 | (JP) . |
| 04372536 | 12/1992 | (JP) . |
| 5216550 | 8/1993 | (JP) . |
| 7-128414 | 5/1995 | (JP) . |
| WO 93/22666 | 11/1993 | (WO) . |
| WO 98/58270 | 12/1998 | (WO) . |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, IEEE, 1986, pp. 365–368.

"A Look at the Impedance of a Cell", by S. Debardelaben, IEEE, 1998, pp. 394–397.

"The Impedance of Electrical Storage Cells", by N.A. Hampson et al., *Journal of Applied Electrochemistry*, 1980, pp. 3–11.

(List continued on next page.)

*Primary Examiner*—Peter S. Wong
*Assistant Examiner*—Gregory J. Toatley, Jr.
(74) *Attorney, Agent, or Firm*—Westman, Champlin & Kelly, P.A.

(57) ABSTRACT

An apparatus for testing a storage battery includes battery test circuitry configured to perform a battery test on the storage battery. The battery test circuitry responsively provides a test result output related to a condition of the storage battery. A test count memory configured to store a test count and test count circuitry is configured to maintain a test count in response to an occurrence of a battery test performed by the battery test circuitry.

25 Claims, 2 Drawing Sheets

U.S. PATENT DOCUMENTS

| | | | |
|---|---|---|---|
| 3,562,634 | 2/1971 | Latner | 31/4 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/66 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 3220/48 |
| 4,707,795 | * 11/1987 | Alber et al. | 702/63 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | Mac Intyre et al. | 324/435 |
| 4,937,528 | 6/1990 | Palanisamy | 324/430 |
| 4,947,124 | 8/1990 | Hauser | 324/430 |
| 4,956,597 | 9/1990 | Heavvvvey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 | 9/1992 | Bosscha | 320/44 |
| 5,144,248 | 9/1992 | Alexandres et al. | 324/428 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 3220/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,451,881 | 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 321/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,546,317 | * 8/1996 | Andrieu | 703/63 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,656,920 | 8/1997 | Cherng et al. | 320/31 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,705,929 | 1/1998 | Caravello et al. | 324/430 |
| 5,710,503 | 1/1998 | Sideris et al. | 320/6 |
| 5,717,336 | 2/1998 | Basell et al. | 324/430 |

| | | | |
|---|---|---|---|
| 5,717,937 | 2/1998 | Fritz | 395/750.01 |
| 5,757,192 | 5/1998 | McShane et al. | 324/427 |
| 5,760,587 | 6/1998 | Harvey | 324/434 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,808,469 | 9/1998 | Kopera | 324/43.4 |
| 5,821,756 | 10/1998 | McShane et al. | 324/430 |
| 5,831,435 | 11/1998 | Troy | 324/426 |
| 5,862,515 | 1/1999 | Kobayashi et al. | 702/63 |
| 5,872,443 | 2/1999 | Williamson | 320/21 |
| 5,914,605 | 6/1999 | Bertness | 324/430 |
| 5,929,609 | 7/1999 | Joy et al. | 322/25 |
| 5,945,829 | 8/1999 | Bertness | 324/430 |
| 6,002,238 | 12/1999 | Champlin | 320/134 |
| 6,008,652 | 12/1999 | Theofanopoulos et al. | 324/434 |
| 6,009,369 | 12/1999 | Boisvert et al. | 701/99 |
| 6,031,354 * | 2/2000 | Wiley et al. | 320/116 |
| 6,037,751 | 3/2000 | Klang | 320/160 |
| 6,037,777 | 3/2000 | Champlin | 324/430 |
| 6,051,976 | 4/2000 | Bertness | 324/426 |
| 6,072,299 * | 6/2000 | Kurle | 320/112 |
| 6,072,300 | 6/2000 | Tsuji | 320/116 |
| 6,081,098 | 6/2000 | Bertness et al. | 320/134 |
| 6,091,245 | 7/2000 | Bertness | 324/426 |
| 6,094,033 | 7/2000 | Ding et al. | 320/132 |
| 6,104,167 | 8/2000 | Bertness et al. | 320/132 |
| 6,138,269 | 10/2000 | Champlin | 320/150 |
| 6,163,156 | 12/2000 | Bertness | 324/426 |
| 6,172,483 | 1/2001 | Champlin | 320/134 |
| 6,172,505 | 1/2001 | Bertness | 324/430 |

OTHER PUBLICATIONS

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance / Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", Japanese Standards Association UDC, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

* cited by examiner under the brief description

TEST COUNTER FOR ELECTRONIC BATTERY TESTER

BACKGROUND OF THE INVENTION

The present invention relates to testing storage batteries. More specifically, the present invention relates to maintaining a count in an electronic battery tester.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. of Burr Ridge, Illinois for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975. to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 1, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May. 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; and U.S. Pat. No. 5,914,605, issued Jun. 22, 1999, entitled ELECTRONIC BATTERY TESTER.

As battery test results have become more accurate, and the repeatability of those results has increased, a new problem has arisen in certain testing situations. In some testing facilities, service personnel are failing to use battery testers when appropriate. For example, if a customer brings a bad battery to a service department, a service personnel may simply replace the battery without actually performing a battery test to determine that the failure is with the battery and not with the battery charging system. This can be particularly problematic for battery manufacturers, battery distributors, and automobile companies who offer warranties with their batteries.

SUMMARY OF THE INVENTION

An apparatus for testing a storage battery includes battery test circuitry configured to perform a battery test on the storage battery. The battery test circuitry responsively provides a test result output related to a condition of the storage battery. A test count memory is configured to store a test count. Test counter circuitry is coupled to the battery test circuitry and test count memory and is to increment the test count in response to an occurrence of a battery test performed by the battery test circuitry. A test count display is configured to display the test count stored in the test count memory. In another aspect, a count is maintained for "good" or "replace" outputs. This allows the total number of batteries tested, and the total number of tests in which a battery was "good" or "bad" to be maintained.

DETAILED DESCRIPTION OF THE ILLUSTRATIVE EMBODIMENTS

The present invention provides a new and useful apparatus and technique for monitoring the use of a battery tester. With the present invention, a tamper proof counter is maintained in the battery tester which stores a count of the number of tests performed by the battery tester. This count corresponds to the number of tests performed over a selected period. This information can be used to monitor use of the battery tester to ensure that the battery tester is being used in comparison to the number of batteries which are being returned under warranty from a particular location.

Figure 1:
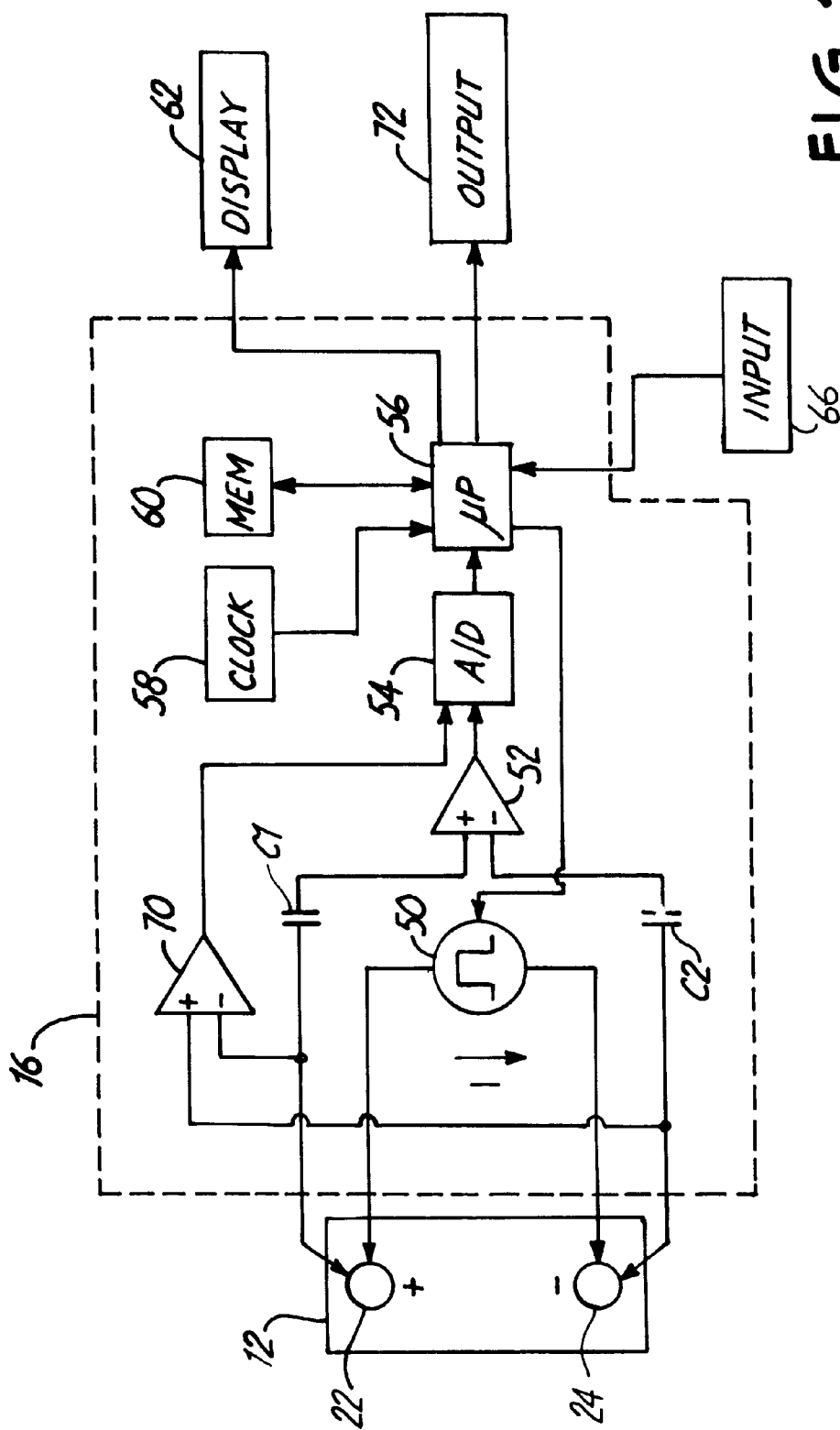
FIG. 1 is a simplified electrical schematic diagram of a battery tester in accordance with one embodiment of the invention.

FIG. 1 is a simplified block diagram of battery monitoring circuitry 16 in accordance with the present invention. Circuitry 16 is shown coupled to battery 12 which includes a positive battery terminal 22 and a negative battery terminal 24. In preferred embodiments, circuitry 16 operates in accordance with battery testing techniques described in the following United States Patents obtained by Dr. Champlin or issued to Midtronics, Inc.: U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12. 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192,. issued May. 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; and U S. Pat. No. 5,945,829, issued Aug. 31, 1999, entitled MIDPOINT BATTERY MONITORING. However, the present invention is applicable to any type of battery tester.

Circuitry 16 operates in accordance with one embodiment of the present invention and determines the conductance G of battery 12 and the voltage potential V between terminals 22 and 24 of battery 12. Circuitry 16 includes current source 50, differential amplifier 52, analog to digital converter 54 and microprocessor 56. Amplifier 52 is capacitively coupled to battery 12 through capacitors $C_1$ and $C_2$. Amplifier 52 has an output connected to an input of analog to digital converter 54. Microprocessor 56 is connected to system clock 58, memory 60 and analog to digital converter 54. Microprocessor 56 is also capable of receiving an input from input device 66 and providing an output through output device 72 or through a display 62.

In operation, current source 50 operates as a forcing function source and, for example, provides a current I in the direction shown by the arrow in FIG. 1. Optionally, current source 50 can operate under the control of microprocessor 56. In one embodiment, this is a square wave, sign wave or pulse signal. However, in one preferred embodiment of the invention, the forcing function includes an AC component. Differential amplifier 52 is connected to terminals 22 and 24 of battery 12 through capacitor $C_1$ and $C_2$, respectively, and provides an output related to the voltage potential difference between terminals 22 and 24. In one preferred embodiment and as illustrated in FIG. 1, amplifier 52 amplifies an AC component of a resultant signal due to the forcing function as measured across terminals 22 and 24. In a preferred embodiment, amplifier 52 has a high input impedance. Circuitry 16 also includes differential amplifier 70 having inverting and non-inverting inputs connected to terminals 22. and 24, respectively. Amplifier 70 is connected to measure an open circuit voltage potential of battery 12 between terminals 22 and 24. The output of amplifier 70 is also provided to analog to digital converter 54 such that the voltage across terminals 22 and 24 can be measured by microprocessor 56.

Circuitry 16 is connected to battery 12 through a four point connection technique known as a Kelvin connection. The Kelvin connection allows the current I to be injected into the battery 12 to a first pair of terminals while the voltage V across terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a forcing function using current source 50. Microprocessor determines a change in battery voltage due to the current pulse using amplifier 58 and analog to digital converter 54. The value of the current I generated by source 50 is either known or is measured. The forcing function can be generated using an active source or by applying a load to battery 12. Microprocessor 56 calculates the conductance of battery 12 using the following equation:

$$G = \Delta I/\Delta V \qquad \text{Eq. 1.}$$

where $\Delta I$ is the change in currernt flowing through battery 12 due to current source 50 and $\Delta V$. is the change in battery voltage due to the applied current $\Delta I$. Based upon the conductance G of the battery and the battery open circuit voltage, the battery tester 16 can determine the condition of battery 12.

In accordance with one aspect, memory 60 also provides a test date memory which stores the dates on which battery tests are completed. This information is used by microprocessor 56 to determine the number of battery tests which have been completed in a given time period of at least one day. For example, microprocessor 56 can determine the number of battery tests which have been completed in a most recent time period such as the last month. Of course, other time periods can also be used.

Figure 2:
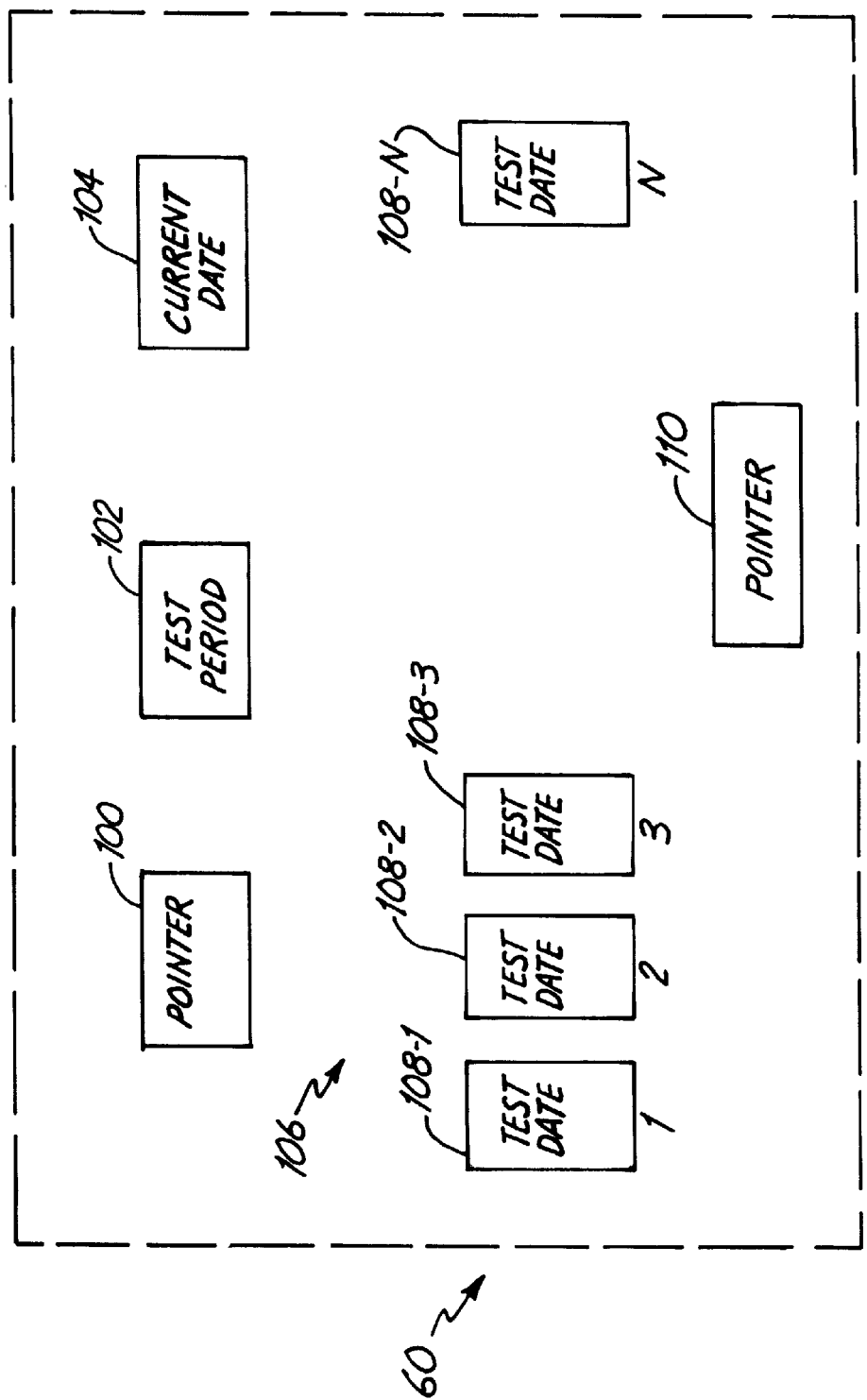
FIG. 2 is a simplified diagram of memory used in the battery tester of FIG. 1.

FIG. 2 is a diagram illustrating a portion of memory 60 in greater detail. Memory 60 includes a First-In-First-Out (FIFO) pointer 100, a stored test period 102 and the current date 104. Additionally, memory 60 includes a First-In-First-Out (FIFO) storage 106 having memory locations 108-1, 108-2, 108-3 . . . 108-N located at memory address 1, 2, 3, . . . N, respectively. In one embodiment, there are at least 100 such locations. Each memory location 108-1 through 108-N is configured to store a test date indicative of the date on which a battery test was performed.

In operation, battery test circuitry 16 performs a battery test as described above. Upon completion of the test, microprocessor 56 stores the date of the test at the address (1-N) of memory locations 108-1 through 108-N based upon the data stored in pointer 100. Pointer 100 is used to point to a particular address location 1-N. The test date is stored in the appropriate location 108-1 through 108-N by retrieving the current date information 104 and transferring it into the appropriate memory locations 108-1 through 108-N as indicated by pointer 100. Following the storing of the test date, pointer 100 is incremented by 1. When pointer 100 equals N, it is reset to 1 and the process repeats. This procedure forms a First-In-First-Out (FIFO) buffer.

Microprocessor can be interrogated using input 66 to provide an output indicating the number of tests which were performed during a test period. The test period can be, for example: a number of days, weeks, etc. and is stored in test period location 102 of memory 60. Microprocessor counts the number of test dates stored in memory locations 108-1 through 108-N, starting with the location pointed to by pointer 100 and proceeding backwards, until the test date stored in a particular location is beyond the date period stored in date period location 102. This count information can be provided on display 62 or through an output device 72 such as a modem or a connection to an external personal computer (PC). The test period 102 can be changed using input 66. Similarly, the current date information 104 is updated daily based upon clock 58 and can be manually changed using input 66. In one embodiment, the current date 104 cannot be changed to an earlier date in order to prevent tampering with the test count over a select period. However, in one embodiment, a special input through input 66 can be used to override this security feature.

In another example embodiment, a second pointer 110 is provided which points to the memory locations 108-1 through 108-N which contains the last rest date which is within the test period stored in 102 relative to the current date stored in 104. In such an embodiment, the number of battery tests performed during the test period can be determined by subtracting the two pointers 110 and 100 to determine how many tests were performed between the current date and the earliest date of the test period. In another example embodiment, the test period does not end with the current date as described above. Instead, the test period 102 can be defined between any two dates. This can be adjusted through user input 66 such that an operator can observe changes in the number of tests performed over differing date ranges. Of course, these are simply example illustrations of techniques to implement the present invention. Those skilled in the art, and those skilled in the art of programming, will recognize that there are numerous different techniques which can be used with determine the number of battery tests which were performed during a particular test period. In another example, each test date location stores information related to the number of tests performed on a specific date. For example, the specific date can also be stored in the memory or the specific date can be determined based upon the current date. For example, address 1 (108-1) can correspond to the number of battery tests performed on the current date, address 2 (108-2) can correspond to the number of tests performed one day prior to the current date, etc. A pointer 100 can then be incremented daily co point to the memory location indicative of the current date Microprocessor 56 operates to provide test counter circuitry and a test counter in accordance with aspects of the invention. However; these functions can be implemented in other devices. Similarly, memory 60 is described herein as providing the test date memory. However, the memory can be implemented Using any appropriate technique. Memory is a non-volatile memory such as an EEPROM.

Although the present invention has been described with reference to preferred embodiments, workers skilled in the art will recognize that changes may be made in form and detail without departing from the spirit and scope of the invention.

What is claimed is:

1. An apparatus for testing a storage battery, comprising:
   battery test circuitry configured to perform a battery test on the storage battery, the battery test circuitry responsively providing a test result output related to a condition of the storage battery;
   a current date memory configured to store a current date;
   a test date memory configured to store test count dates indicative of dates on which a battery test was performed; and
   test counter circuitry coupled to the battery test circuitry and test date memory, the test counter circuitry configured to store a current date in the test date memory in response to an occurrence of a battery test performed by the battery test circuitry the stored current date indicative of a date on which a battery test was performed, the test counter circuitry further configured to determine a number of battery tests performed during a test period of at least one day as a function of the stored test dates in the test date memory.

2. The apparatus of claim 1 wherein the battery test circuitry is configured to couple to the storage battery using Kelvin connections.

3. The apparatus of claim 1 wherein the battery test circuitry measures conductance of the battery.

4. The apparatus of claim 1 wherein the battery test circuitry measures impedance of the battery.

5. The apparatus of claim 1 including a test count display configured to display the determined number of battery tests.

6. The apparatus of claim 5 including a user input and wherein the test count display is configured to display the test count following entry of a code through the user input.

7. The apparatus of claim 1 wherein the memory comprises non-volatile memory.

8. The apparatus of claim 1 including a test count output configured to transmit the determined number of battery tests to a remote location.

9. The apparatus of claim 8 wherein the test count output comprises a modem.

10. The apparatus of claim 1 including a reset input configured to clear the test count from the test count memory.

11. The apparatus of claim 1 wherein the test date memory is configured as a First-In-First-Out (FIFO).

12. The apparatus of claim 11 wherein the test period comprises a most recent number of days and wherein test dates older than the most recent number of dates are deleted.

13. The apparatus of claim 1 wherein the test period comprises a most recent number of days and wherein test dates older than the most recent number of dates are deleted.

14. The apparatus of claim 1 wherein the test date memory is sufficiently large to store at least 100 test dates.

15. The apparatus of claim 1 including an output adapted to couple to a personal computer to communicate the determined number of tests.

16. The apparatus of claim 1 wherein the currernt date stored in the current date memory cannot be altered to an earlier date.

17. The apparatus of claim 1 wherein the test counter circuitry stores the current date upon completion of a battery test.

18. The apparatus of claim 1 including a memory pointer configured to point to the stored dates in the test date memory.

19. The apparatus of claim 18 including a second pointer configured to point to a second stored date in the test date memory the second stored date related to the test period.

20. The apparatus of claim 1 wherein the test period is stored in the memory.

21. The apparatus of claim 1 wherein the stored current date corresponds to a memory location in the test date memory and the memory location stores a number of tests performed on the test date.

22. A method for monitoring use of a battery tester, comprising:

performing a battery test on a battery using the battery tester;

storing information in a memory related to a current date on which the battery test was performed; and determining the number of battery tests performed during a test period of at least one day as a function of stored date information.

23. The method of claim 22 including incrementing a pointer which points to memory locations which store date information.

24. The method of claim 23 including a pointer which points to a memory location related to the current date and wherein the memory location contains the number of tests performed on the current date.

25. The method of claim 22 including outputting the determined number of tests in response to receipt of a security code.

* * * * *